(12) United States Patent
Kim et al.

(10) Patent No.: US 8,710,897 B2
(45) Date of Patent: Apr. 29, 2014

(54) LEVEL SHIFTER AND METHOD OF USING THE SAME

(75) Inventors: Hyoung-kyu Kim, Cheongju-si (KR); Jin-wook Kim, Cheongju-si (KR); Bae-kun Choi, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/488,050

(22) Filed: Jun. 4, 2012

(65) Prior Publication Data

US 2012/0313685 A1    Dec. 13, 2012

(30) Foreign Application Priority Data

Jun. 9, 2011    (KR) .................. 10-2011-0055745

(51) Int. Cl.
*H03L 5/00*    (2006.01)

(52) U.S. Cl.
USPC .......................................... 327/333

(58) Field of Classification Search
None
See application file for complete search history.

(56) References Cited

U.S. PATENT DOCUMENTS

| 6,128,230 | A * | 10/2000 | Amanai ................. 365/185.23 |
| 7,501,876 | B2 * | 3/2009 | Kimura ....................... 327/333 |
| 8,169,250 | B2 * | 5/2012 | Miyoshi et al. .............. 327/333 |
| 2006/0290404 | A1 * | 12/2006 | Law ............................. 327/333 |
| 2010/0201427 | A1 | 8/2010 | Van den Berg et al. | |

* cited by examiner

*Primary Examiner* — Lincoln Donovan
*Assistant Examiner* — Khareem E Almo
(74) *Attorney, Agent, or Firm* — NSIP Law

(57) ABSTRACT

A level shifter and a method of operating a level shifter are provided. The level shifter includes a first-level shifter unit configured to convert an external input signal into a signal in a preset first-voltage range using a plurality of transistors and output the converted signal and a second-level shifter unit configured to convert the signal output from the first-level shifter unit into a signal in a preset second-voltage range using a plurality of transistors and output the converted signal.

22 Claims, 6 Drawing Sheets

LEVEL SHIFTER AND METHOD OF USING THE SAME

CROSS-REFERENCE TO RELATED APPLICATION

This application claims the benefit under 35 U.S.C. §119(a) of Korean Patent Application No. 10-2011-0055745, filed on Jun. 9, 2011, in the Korean Intellectual Property Office, the entire disclosure of which is incorporated herein by reference for all purposes.

BACKGROUND

1. Field

The following description relates to a level shifter, such as, for example, a level shifter capable of converting a low-voltage input signal into a high-voltage output signal without using a high-voltage transistor.

2. Description of Related Art

A system on chip (SOC) that implements a circuit system typically includes various semiconductor circuits that are integrated on a single chip. A SOC is conventionally designed such that high-performance blocks use a high voltage and low-performance blocks use a low voltage in order to save energy. However, because different voltages are used in neighboring blocks, a leakage current may develop or malfunction may occur in an interface area between the blocks.

To reduce the occurrence of malfunction, a level shifter may be used as an interface circuit that adjusts voltage levels between the blocks. A level shifter converts a voltage supplied from an outside into a higher voltage or a lower voltage, depending on a voltage used in the block.

In a conventional device, a plurality of level shifters connected in series is used to convert a low-voltage signal supplied from an outside into a high-voltage signal, for example.

Hereinafter, an operation of a level shifter is described with reference to FIG. 6.

The level shifter illustrated in FIG. 6 converts a low-voltage signal of 0 V to 1.5 V into a high-voltage signal of 5V to 10V.

Referring to FIG. 6, first, the low-voltage signal of 0 V to 1.5V is converted a normal-voltage signal of 0 V to 5V, using a first-level shifter unit constituting of a medium-voltage transistor. The medium-voltage transistor used in this level shifter unit is a transistor having $V_{GS}$ and $V_{DS}$ voltages of 6 V or less.

Next, the normal-voltage signal of 0 V to 5 V is converted into a high-voltage signal of 0 V to 10 V, using a second-level shifter unit constituting of a high-voltage transistor. The high-voltage transistor used in this level shifter unit is a transistor having $V_{GS}$ and $V_{DS}$ voltages of 6 V or more.

Finally, the high-voltage signal of 0 V to 10 V is converted into a high-voltage signal of 5 V to 10 V, using a third-level shifter unit constituting of a high-voltage transistor.

The first-level, second-level and third-level shifter units may occupy a substantial area on a chip in order to convert a low-voltage signal into a high-voltage signal. Further, when a fabrication process that does not support a transistor having the $V_{GS}$ voltage of 6 V or more is used, it is difficult to fabricate the level shifter.

SUMMARY

In one general aspect, there is provided a level shifter including: a first-level shifter unit configured to convert an external input signal into a signal in a preset first-voltage range using a plurality of transistors and output the converted signal; and a second-level shifter unit configured to convert the signal output from the first-level shifter unit into a signal in a preset second-voltage range using a plurality of transistors and output the converted signal, in which an upper-threshold voltage of the second-voltage range is higher than that of the first-voltage range and a lower-threshold voltage of the second-voltage range is higher than that of the first-voltage range, and in which, in each of the plurality of transistors in the first-level shifter unit and the plurality of transistors in the second-level shifter unit, a voltage between a gate and a source thereof is equal to or less than 6 V.

The first-level shifter unit may include: a first transistor and a second transistor arranged in pairs and commonly connected to a first power supply having a first voltage level; a third transistor having a gate that receives a first clamping power supply and a source that is commonly connected to a drain of the first transistor and to a gate of the second transistor; a fourth transistor having a gate that receives the first clamping power supply and a source that is commonly connected to a gate of the first transistor and to a drain of the second transistor; a fifth transistor having a gate that receives the external input signal, a drain that is connected to a drain of the third transistor, and a source that is connected to a second power supply having a second voltage level; an inverter configured to invert the external input signal and output the inverted external input signal; and a sixth transistor having a gate that receives the external input signal inverted in the inverter, a drain that is connected to a drain of the fourth transistor, and a source that is connected to the second power supply. A connection node between the first transistor and the third transistor may be a first output terminal of the first-level shifter unit, and a connection node between the second transistor and the fourth transistor may be a second output terminal of the first-level shifter unit.

The first transistor, the second transistor, the third transistor and the fourth transistor may be PMOS transistors; and the fifth transistor and the sixth transistor may be NMOS transistors.

The first voltage level may be 5 V. The second voltage level may be 0 V. The first clamping voltage may be 2 V.

The second-level shifter unit may include: a seventh transistor and an eighth transistor arranged in pairs and commonly connected to a third power supply having a third voltage level; a ninth transistor having a gate that receives a second clamping power supply, and a source that is commonly connected to a drain of the seventh transistor and to a gate of the eighth transistor; a tenth transistor having a source that is commonly connected to a gate of the seventh transistor and to a drain of the eighth transistor; an eleventh transistor having a gate that is connected to the second output terminal of the first-level shifter unit, a drain that is connected to a drain of the ninth transistor, and a source that is connected to a fourth power supply having a fourth voltage level; and a twelfth transistor having a gate that is connected to the first output terminal of the first-level shifter unit, a drain that is connected to a drain of the tenth transistor, and a source that is connected to the fourth power supply. A connection node between the seventh transistor and the ninth transistor may be a third output terminal of the second-level shifter unit, and a connection node between the eighth transistor and the tenth transistor may be a fourth output terminal of the second-level shifter unit.

The seventh transistor, the eighth transistor, the ninth transistor and the tenth transistor may be PMOS transistors; and the eleventh transistor and the twelfth transistor may be NMOS transistors.

The third voltage level may be 8 V. The fourth voltage level may be 3V. The second clamping voltage may be 4 V.

The level shifter may further include a third-level shifter unit configured to convert the signal output from the second-level shifter unit into a signal in a preset third-voltage range using a plurality of transistors and output the converted signal, in which an upper-threshold voltage of the third-voltage range is higher than that of the second voltage level and a lower-threshold voltage of the third-voltage range is higher than that of the second-voltage range, and in which, in each of the plurality of transistors, a voltage difference between a gate and a source is equal to or less than 6V.

The third-level shifter unit may include: a thirteenth transistor and a fourteenth transistor arranged in pairs and commonly connected to a fifth power supply having a fifth voltage level; a fifteenth transistor having a gate that is connected to one of the third output terminal and the fourth output terminal of the second-level shifter unit, a drain that is commonly connected to a drain of the thirteenth transistor and a gate of the fourteenth transistor, and a source that is connected to a sixth power supply having a sixth voltage level; and a sixteenth transistor having a gate that is connected to the other of the third output terminal and the fourth output terminal of the second-level shifter unit, a drain that is commonly connected to a gate of the thirteenth transistor and a drain of the fourteenth transistor, and a source that is connected to the sixth power supply. A connection node between the thirteenth transistor and the fifteenth transistor may be a fifth output terminal of the third-level shifter unit, and a connection node between the fourteenth transistor and the sixteenth transistor may be a sixth output terminal of the third-level shifter unit.

The thirteenth transistor and the fourteenth transistor may be PMOS transistors, and the fifteenth transistor and the sixteenth transistor may be NMOS transistors.

The fifth voltage level may be 10 V, and the sixth voltage level may be 5V.

The first-voltage range may range from 0 V to 5 V, the second-voltage range may range from 3 V to 8 V, and the third-voltage range may range from 5 V to 10 V.

In another aspect, there is provided a system on chip comprising a plurality of blocks and a level shifter described above.

In yet another aspect, there is provided a method of operating a level shifter, the method involving: converting an external input signal into a first signal in a preset first-voltage range with a first set of transistors; and converting the first signal into a second signal in a preset second-voltage range using a second set of transistors, in which an upper-threshold voltage of the second-voltage range is higher than an upper-threshold voltage of the first-voltage range, and a lower-threshold voltage of the second-voltage range is higher than a lower-threshold voltage of the first-voltage range, and the first set and the second set of transistors are medium-voltage transistors.

A voltage difference between a gate and a source of each transistor in the first set and the second set of transistors may be equal to or less than 6 V.

A voltage difference between a gate and a drain of each transistor in the first set and the second set of transistors may be equal to or less than 6 V.

The first set of transistors may include: a first transistor and a second transistor arranged in pairs and commonly connected to a first power supply having a first voltage level; a third transistor having a gate that receives a first clamping power supply and a source that is commonly connected to a drain of the first transistor and a gate of the second transistor; a fourth transistor having a gate that receives the first clamping power supply and a source that is commonly connected to a gate of the first transistor and a drain of the second transistor; a fifth transistor having a gate that receives the external input signal, a drain that is connected to a drain of the third transistor, and a source that is connected to a second power supply having a second voltage level; an inverter configured to invert the external input signal and output the inverted external input signal; and a sixth transistor having a gate that receives the external input signal inverted in the inverter, a drain that is connected to a drain of the fourth transistor, and a source that is connected to the second power supply.

The second set of transistors may include: a seventh transistor and an eighth transistor arranged in pairs and commonly connected to a third power supply having a third voltage level; a ninth transistor having a gate that receives a second clamping power supply, and a source that is commonly connected to a drain of the seventh transistor and to a gate of the eighth transistor; a tenth transistor having a source that is commonly connected to a gate of the seventh transistor and to a drain of the eighth transistor; an eleventh transistor having a gate that is connected to the second output terminal of the first-level shifter unit, a drain that is connected to a drain of the ninth transistor, and a source that is connected to a fourth power supply having a fourth voltage level; and a twelfth transistor having a gate that is connected to the first output terminal of the first-level shifter unit, a drain that is connected to a drain of the tenth transistor, and a source that is connected to the fourth power supply.

The first transistor, the second transistor, the third transistor and the fourth transistor may be PMOS transistors; and the fifth transistor and the sixth transistor may be NMOS transistors.

The seventh transistor, the eighth transistor, the ninth transistor and the tenth transistor may be PMOS transistors; and the eleventh transistor and the twelfth transistor may be NMOS transistors.

The general aspect of the method may further involve: converting the second signal into a third signal in a preset third-voltage range using a third set of transistors, in which an upper-threshold voltage of the third-voltage range is higher than an upper-threshold voltage of the second voltage level, and a lower-threshold voltage of the third-voltage range is higher than a lower-threshold voltage of the second-voltage range, and the first set, the second set and the third set of transistors are medium-voltage transistors.

Other features and aspects may be apparent from the following detailed description, the drawings, and the claims.

Figure 1:
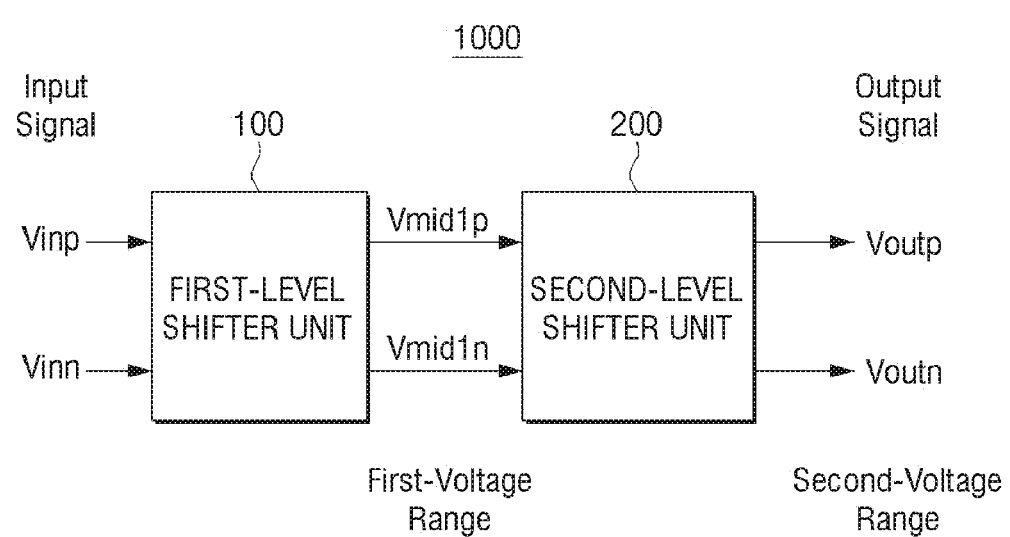
FIG. 1 is a diagram illustrating a level shifter according to an example embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. In addition, descriptions of well-known functions and constructions may be omitted for increased clarity and conciseness.

FIG. 1 illustrates a level shifter according to a first example embodiment.

Referring to FIG. 1, a level shifter 1000 includes a first-level shifter unit 100 and a second-level shifter unit 200.

The first-level shifter 100 converts external input signals Vinp and Vinn into a signal in a preset first-voltage range using a plurality of transistors and outputs the converted signals Vmid1p and Vmid1n. A detailed configuration and operation of the first-level shifter unit 100 is described with reference to FIGS. 3 and 4 later.

In this example, the external input signal may be a signal in a voltage range of 0 V to 1.5 V, and the preset first-voltage range may range, for example, from 0 V to 5 V. Each of the plurality of transistors included in the first-level shifter unit 100 may be a medium-voltage transistor. In a medium-voltage transistor, the voltage difference $V_{GS}$ between a gate and a source may be equal to or less than 6 V, and/or the voltage difference $V_{DS}$ between a drain and the source thereof may be equal to or less than 6 V.

The second-level shifter unit 200 converts the signals Vmid1p and Vmid1n from the first-level shifter unit 100 into a signal in a preset second-voltage range using a plurality of transistors. The second-level shifter unit 200, then, outputs the converted signals Voutp and Voutn. Details regarding the configuration and operation of the second-level shifter unit 200 are described with reference to FIGS. 3 and 4 later.

In this example, a lower-threshold voltage of the preset second-voltage range output by the second-level shifter unit 200 may be higher than that of the first-voltage range of the first-level shifter unit 100. Further, an upper-threshold voltage of the preset second-voltage range output by the second-level shifter unit 200 may be higher than that of the first-voltage range of the first-level shifter unit 100. For example, the second-voltage range may range from 3 V to 8 V. Each of the plurality of transistors included in the second-level shifter unit 200 may be a medium-voltage transistor. In the medium-voltage transistor, the voltage difference $V_{GS}$ between a gate and a source of the medium-voltage transistor may be equal to or less than 6 V, and/or the voltage difference $V_{DS}$ between a drain and the source of the medium transistor may be equal to or less than 6 V.

The level shifter 1000 according to the example described above is capable of converting a low-voltage signal in the range of 0 V to 1.5 V into a high-voltage signal in the range of 3 V to 8 V without using a high-voltage transistor. Rather, the level shifter 1000 uses medium-voltage transistors. Because a high-voltage transistor is not used, the size of the level shifter may be reduced, and the level shifter may be fabricated through a fabrication process that does not support $V_{GS}$ of 6 V or more.

Although FIG. 1 illustrates a level shifter 1000 that includes only two level shifter units, in other examples, the level shifter may include three or more level shifter units.

Hereinafter, an example in which the level shifter 1000 includes three level shifter units is described with reference to FIG. 2.

Figure 2:
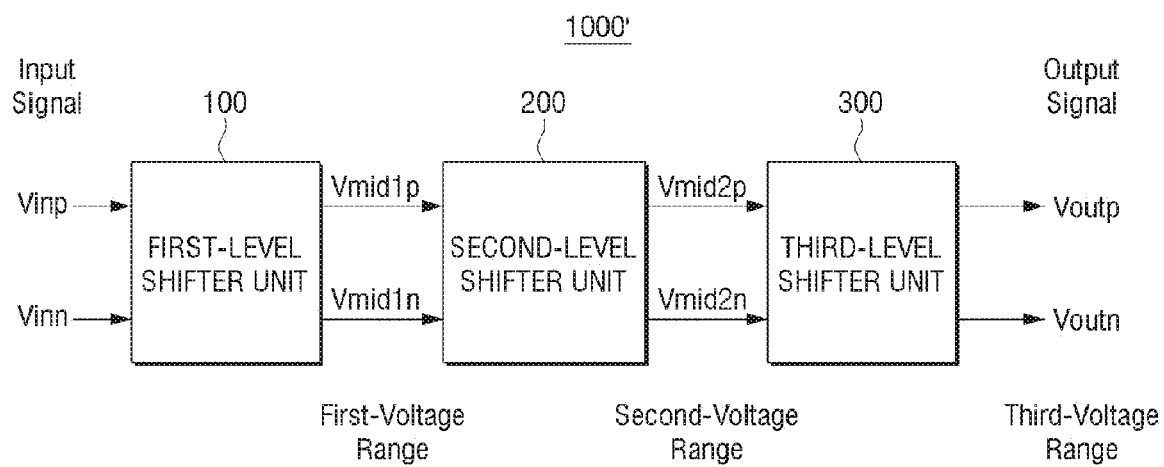
FIG. 2 is a diagram illustrating a level shifter according to a second example embodiment.

FIG. 2 illustrates a level shifter according to a second example embodiment.

Referring to FIG. 2, a level shifter 1000' includes a first-level shifter unit 100, a second-level shifter unit 200, and a third-level shifter unit 300. Other than the addition of a third-level shifter unit 300, components of the level shifter 1000' of the second example embodiment are the same as the components of the level shifter 1000 of the first example embodiment. Therefore, description of components other than the third-level shifter unit 300 is omitted.

The third-level shifter unit 300 converts the signal output from the second-level shifter unit into a signal in a preset third-voltage range using a plurality of transistors. A detailed configuration and operation of the third-level shifter unit 300 is described with reference to FIGS. 3 and 4 later. In this example, a lower-threshold voltage of the preset third-voltage range is set to be higher than that of the second-voltage range of the second-level shifter unit 200, and an upper-threshold voltage of the preset third-voltage range is set to be higher than that of the second-voltage range of the second-level shifter unit 200. For example, the third-voltage range may range from 5 V to 10 V. Each of the plurality of transistors included in the third-level shifter unit 300 may be a medium-voltage transistor. In the medium-voltage transistor, a voltage difference $V_{GS}$ between a gate and a source thereof is equal to or less than 6 V, and/or the voltage difference $V_{DS}$ between a drain and the source is equal to or less than 6 V.

The level shifter 1000' is capable of converting a low-voltage signal in the range of 0 V to 1.5 V into a high-voltage signal in the range of 5 V to 10 V, without using a high-voltage transistor. Rather, the level shifter 1000' uses medium-voltage transistors. Because a high-voltage transistor is not used, the size of the level shifter may be reduced, and the level shifter may be fabricated through a fabrication process that does not support $V_{GS}$ of 6 V or more.

Figure 3:
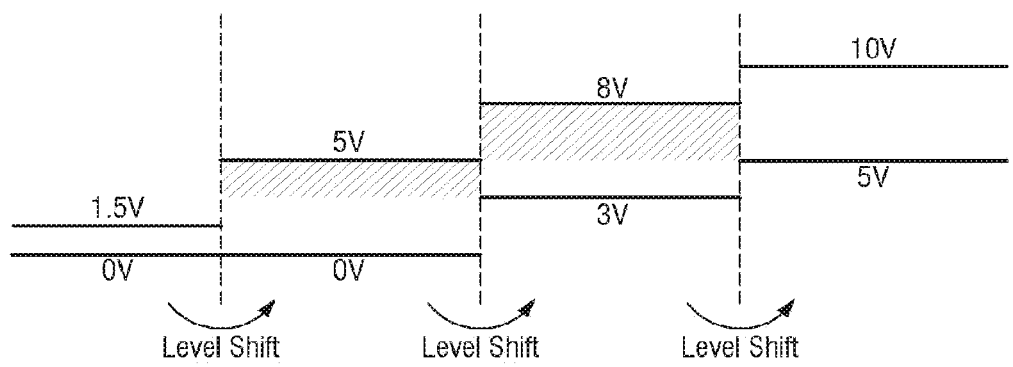
FIG. 3 is a diagram illustrating an operation of the level shifter according to the second example embodiment.

FIG. 3 illustrates an operation of the level shifter according to the second example embodiment.

Referring to FIG. 3, an external input signal in a low-voltage range of 0 V to 1.5 V is converted into a medium-voltage signal in the range of 0 V to 5 V through the first-level shifter unit 100.

Next, the signal in the medium-voltage range of 0 V to 5 V is converted into a signal in a high-voltage range of 3 V to 8 V, using the second-level shifter unit 200.

Finally, the signal in the high voltage range of 3 V to 8 V is converted into a signal in a high-voltage range of 5V to 10 V, using the third-level shifter unit 300.

Therefore, the level shifter 1000' may convert the external input signal in the low-voltage range of 0V to 1.5 V into the signal in the high-voltage range of 5 V to 10 V.

In other examples, the level shifter may be configured so that level shifter units have different voltage ranges from those of the level shifter units shown in FIG. 3. For example, the first-level shifter 100 may be configured to convert the external input signal into a signal in a voltage range of 0 V to 5 V. The second-level shifter unit 200 may be implemented to convert the output signal of the first-level shifter unit 100 into a signal in a voltage range of 2 V to 7 V. The third-level shifter unit 300 may be implemented to convert the output signal of the second-level shifter unit 200 into a signal in a voltage range of 5 V to 10 V.

In addition, the level shifter may be implemented to convert an input signal in a low-voltage range into a signal in a high-voltage range of 5 V to 10 V, using four or more level shifter units. In yet other examples, a level shifter may be implemented to convert an input signal in a low-voltage range into a signal in a higher voltage range than the voltage range of 5 V to 10 V.

Figure 4:
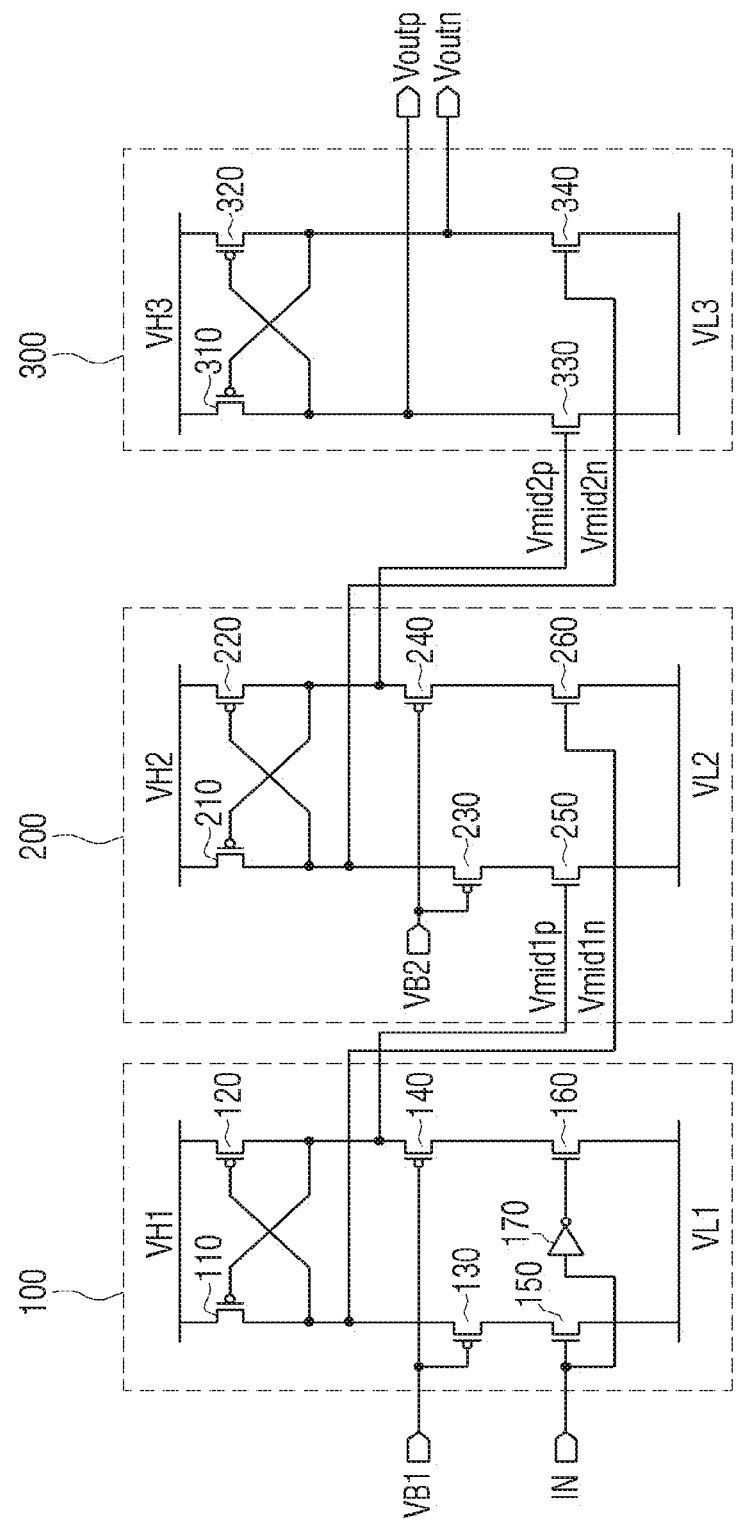
FIG. 4 is a circuit diagram of the level shifter according to the second example embodiment.

FIG. 4 is a circuit diagram of the level shifter according to the second example embodiment.

Referring to FIG. 4, the level shifter 1000' includes the first-level shifter unit 100, the second-level shifter unit 200, and the third-level shifter unit 300.

The first-level shifter unit 100 includes first to sixth transistors 110 to 160 and an inverter 170.

The first transistor 110 is connected to a first power supply VH1 having a first-voltage level. For instance, a source of the first transistor 110 is connected to the first power supply VH1. A drain of the first transistor 110 is commonly connected to a first output terminal Vmid1$n$ of the first-level shifter unit 100 to which a gate of the second transistor 120 and a source of the third transistor 130 are commonly connected. A gate of the first transistor 110 is connected to a second output terminal Vmid1$p$ of the first-level shifter unit 100 to which a drain of the second transistor 120 and a source of the fourth transistor 140 are commonly connected. In this example, the first transistor 110 may be a PMOS transistor. The first voltage level may be 5 V.

The second transistor 120 is connected to the first power supply VH1 having the first voltage level. For instance, a source of the second transistor 120 is connected to the first power supply VH1. A drain of the second transistor 120 is connected to the second output terminal Vmid1$p$ of the first-level shifter unit 100 to which the gate of the first transistor 120 and the source of the fourth transistor 140 are commonly connected. A gate of the second transistor 120 is connected to the first output terminal Vmid1$n$ of the first-level shifter unit 100 to which the source of the first transistor 110 and a drain of the third transistor 130 are commonly connected. The second transistor may be a PMOS transistor.

The third transistor 130 receives a first clamping power supply VB1. For instance, the source of the third transistor is connected to the first output terminal Vmid1$n$ of the first-level shifter unit 100 which is commonly connected to the drain of the first transistor 110 and the gate of the second transistor 120. A drain of the third transistor 130 is connected to a drain of the fifth transistor. A gate of the third transistor 130 receives the first clamping voltage VB1. In this example, the third transistor 130 may be a PMOS transistor.

The fourth transistor 140 receives the first clamping power supply VB1. For instance, a source of the fourth transistor 140 is connected to the second output terminal Vmid1$p$ of the first-level shifter unit 100 which is commonly connected to the drain of the second transistor 120 and the gate of the first transistor 110. A drain of the fourth transistor 140 is connected to a drain of the sixth transistor 160. A gate of the fourth transistor 140 receives the first clamping voltage VB1. In this example, the fourth transistor 140 may be a PMOS transistor.

In this example, the first clamping power supply VB1 is configured to prevent the output voltage of the first-level shifter unit 100 from being lower than a lower-threshold voltage VL2 of the second-level shifter unit 200. The first clamping voltage supply VB1 may, for example, provide 2 V. Since the first clamping power supply VB1 is supplied to the gates of the third transistor 130 and the transistor 140, a voltage difference between the gate and source of each of the plurality of transistors in the first-level shifter unit 100 does not exceed a voltage of 6V.

The fifth transistor 150 receives an external input signal Vin. A drain of the fifth transistor 150 is connected to the drain of the third transistor 130. A source of the fifth transistor 150 is connected to a second power supply VL1 having a second voltage level. A gate of the fifth transistor 150 receives an external input signal Vin. In this example, the fifth transistor may be an NMOS transistor. In addition, the second voltage level may be 0 V or a ground voltage.

The inverter 170 inverts the external input signal (Vin) and outputs the inverted external input signal. For example, the inverter 170 receives the external input signal Vin, inverts the received external input signal Vin, and outputs the inverted external input signal.

The sixth transistor 160 receives the inverted external input signal. For instance, a drain of the sixth transistor 160 is connected to the drain of the fourth transistor 140. A source of the sixth transistor 160 is connected to the second power supply VL1. A gate of the sixth transistor 160 is connected to an output terminal of the inverter 170. In this example, the sixth transistor 160 may be an NMOS transistor.

By the above-described configuration, the first-level shifter unit 100 may convert an external input signal Vin in a voltage range of 0 V to 1.5 V into a signal in a voltage range of 0 V to 5 V and may output the converted signal.

The second-level shifter unit 200 includes seventh to twelfth transistors 210 to 260.

The seventh transistor 210 is connected to a third power supply VH2 having a third voltage level. For instance, a source of the seventh transistor 210 is connected to the third power supply VH2. A drain of the seventh transistor 210 is connected to a third output terminal Vmid2$n$ of the level shifter unit 200 which is commonly connected to a gate of the eighth transistor 220 and a source of the ninth transistor 230. A gate of the seventh transistor 210 is connected to a fourth output terminal Vmid2$p$ of the second-level shifter 200 which is commonly connected to a drain of the eighth transistor 220 and a source of the tenth transistor 240. In this example, the seventh transistor 210 may be a PMOS transistor. The third voltage may be 8 V.

The eighth transistor 220 is connected to a third power supply VH2 having a third voltage level. For instance, a source of the eighth transistor 220 is connected to the third power supply VH2. A drain of the eighth transistor 220 is connected to the fourth output terminal Vmid2$p$ of the second-level shifter unit 200 which is commonly connected to the gate of the seventh transistor 210 and the source of the tenth transistor 240. A gate of the eighth transistor 220 is connected to the third output terminal Vmid2$n$ of the second-level shifter unit 200 which is commonly connected to the drain of the seventh transistor 210 and a source of the ninth transistor 230. In this example, the eighth transistor 220 may be a PMOS transistor.

The ninth transistor 230 receives a second clamping power supply VB2. For instance, the source of the ninth transistor 230 is connected to the third output terminal Vmid2$n$ of the second-level shifter unit 200 which is commonly connected to the drain of the seventh transistor 210 and the gate of the eighth transistor 220. A drain of the ninth transistor 230 is connected to a drain of the eleventh transistor 250. A gate of the ninth transistor 230 receives the second clamping power supply VB2. In this example, the ninth transistor 230 may be a PMOS transistor.

The tenth transistor 240 receives the second clamping power supply VB2. Specifically, the source of the tenth transistor 240 is connected to the fourth output terminal Vmid2$p$ of the second-level shifter unit 200 to which the drain of the eighth transistor 220 and the gate of the seventh transistor 210 are commonly connected. A drain of the tenth transistor 240 is connected to a drain of the second of the twelfth transistor

260. A gate of the tenth transistor 240 receives the second clamping power supply VB2. The tenth transistor may be a PMOS transistor.

In this example, the second clamping power supply VB2 is configured to prevent an output voltage of the second-level shifter unit 200 from being lower than a lower-threshold voltage VL3 of the third-level shifter unit 300. The second clamping power supply VB2 may provide, for example, 4 V. Since the second clamping power supply VB2 is supplied to the gates of the ninth transistor 230 and the tenth transistors, a voltage difference between the gate and source of each of the plurality transistors does not exceed a voltage of 6 V.

The eleventh transistor 250 is connected to the second output terminal Vmid1p of the first-level shifter unit 100. For instance, the drain of the eleventh transistor 250 is connected to the drain of the ninth transistor 230. A source the eleventh transistor 250 is connected to a fourth power supply VL2 having a fourth voltage level. A gate the eleventh transistor 250 is connected to the second output terminal Vmid1p of the first-level shifter 100. In this example, the eleventh transistor 250 may be an NMOS transistor. The fourth voltage level may be 3 V.

The twelfth transistor 260 is connected to the first output terminal Vmid1n of the first-level shifter 100. For instance, the drain of the twelfth transistor 260 may be connected to the drain of the tenth transistor 240. A source of the twelfth transistor 260 may be connected to the fourth power supply VL2. A gate of the twelfth transistor 260 may be connected to the first output terminal Vmid1n of the first-level shifter unit 100. At this time, the twelfth transistor 260 may be an NMOS transistor.

By the above-described configuration, the second-level shifter unit 200 may convert the output signal of the first-level shifter unit 100 in the first-voltage range of 0 V to 5 V into a signal in a second-voltage range of 3 V to 8 V.

The third-level shifter unit 300 includes thirteenth to sixteenth transistors 310 to 340.

The thirteenth transistor 310 is connected to a fifth power supply VH3 having a fifth voltage level. For instance, a source of the thirteenth transistor 310 is connected to the fifth power supply VH3. A drain of the thirteenth transistor 310 is connected to a fifth output terminal Voutn of the third-level shifter unit 300 to which a gate of the fourteenth transistor 320 and a drain of the fifteenth transistor 330 are commonly connected. A gate of the thirteenth transistor 310 is connected to a sixth output terminal Voutp of the third-level shifter unit 300. At this time, the thirteenth transistor may be a PMOS transistor. The third voltage level may be 10 V.

The fourteenth transistor 320 is connected to the fifth power supply VH3 having the fifth voltage level. For instance, a source of the fourteenth transistor 320 is connected to the fifth power supply VH3. A drain of the fourteenth transistor 320 is connected to the sixth output terminal Voutp of the third-level shifter unit 300 to which the gate of the thirteenth transistor 310 and the drain of the sixteenth transistor 340 are commonly connected. A gate of the fourteenth transistor 320 is connected to the fifth output terminal Voutn of the second-level shifter unit 200 to which the drain of the thirteenth transistor 310 and the drain of the fourteenth transistor 320 are commonly connected. In this example, the fourteenth transistor may be a PMOS transistor.

The fifteenth transistor 330 is connected to the fourth output terminal Vmid2p of the second-level shifter unit 200. For instance, the drain of the fifteenth transistor 330 is connected to the fifth output terminal Voutp of the third-level shifter unit 330 to which the drain of the thirteenth transistor 310 and the gate of fourteenth transistor 320 are commonly connected. A source of the fifteenth transistor 330 is connected to a sixth power supply VL3 having a sixth voltage level. A gate of the fifteenth transistor 330 is connected to the fourth output terminal Vmid2p of the second-level shifter unit 200. In this example, the fifth transistor 330 may be an NMOS transistor.

The sixteenth transistor 340 is connected to the third output terminal Vmid2n of the second-level shifter unit 200. For instance, a drain of the sixteenth transistor 340 is connected to a sixth output terminal Voutn of the third-level shifter unit 300 to which the drain of the fourteenth transistor 320 and the gate of the thirteenth transistor 310 are commonly connected. A source of the sixteenth transistor 340 is connected to the sixth power supply VL3. A gate of the sixteenth transistor 340 is connected to the third output terminal Vmid2n of the second-level shifter unit 200. The sixteenth transistor 340 may be an NMOS transistor.

By the above-described configuration, the level shifter unit 300 may convert the output signal of a second-level shifter unit 200 in a second-voltage range of 5 V to 8V into a signal in a third-voltage range of 5 V to 10 V and output the converted signal.

Figure 6:
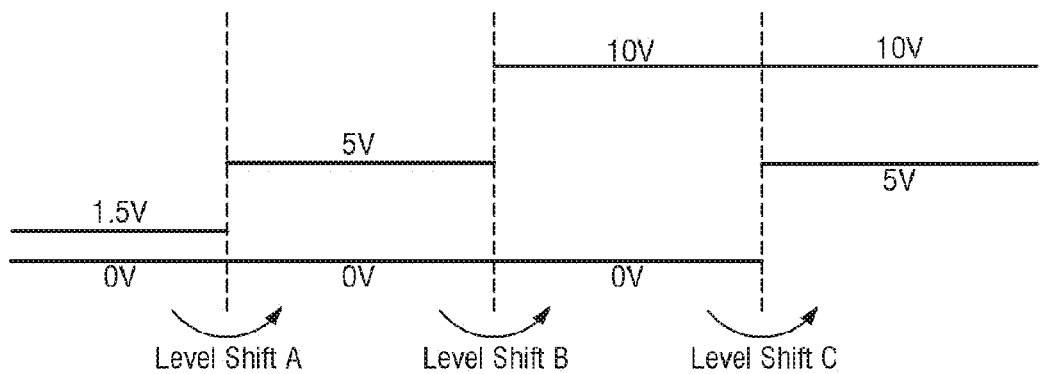
FIG. 6 is a diagram illustrating an operation of a conventional level shifter.

When the level shifter is implemented using only medium-voltage transistors as shown on FIG. 4, the level shifter may have a dimension of approximately 378 $\mu m^2$. Meanwhile, when the level shifter is implemented using high-voltage transistors as shown in FIG. 6, the level shifter has approximately a dimension of 6642 $\mu m^2$. Thus, by not using high-voltage transistors, the dimension of the level shifter may be reduced to approximately ⅕ times the dimension of a level shifter that uses high-voltage transistors.

Figure 5:
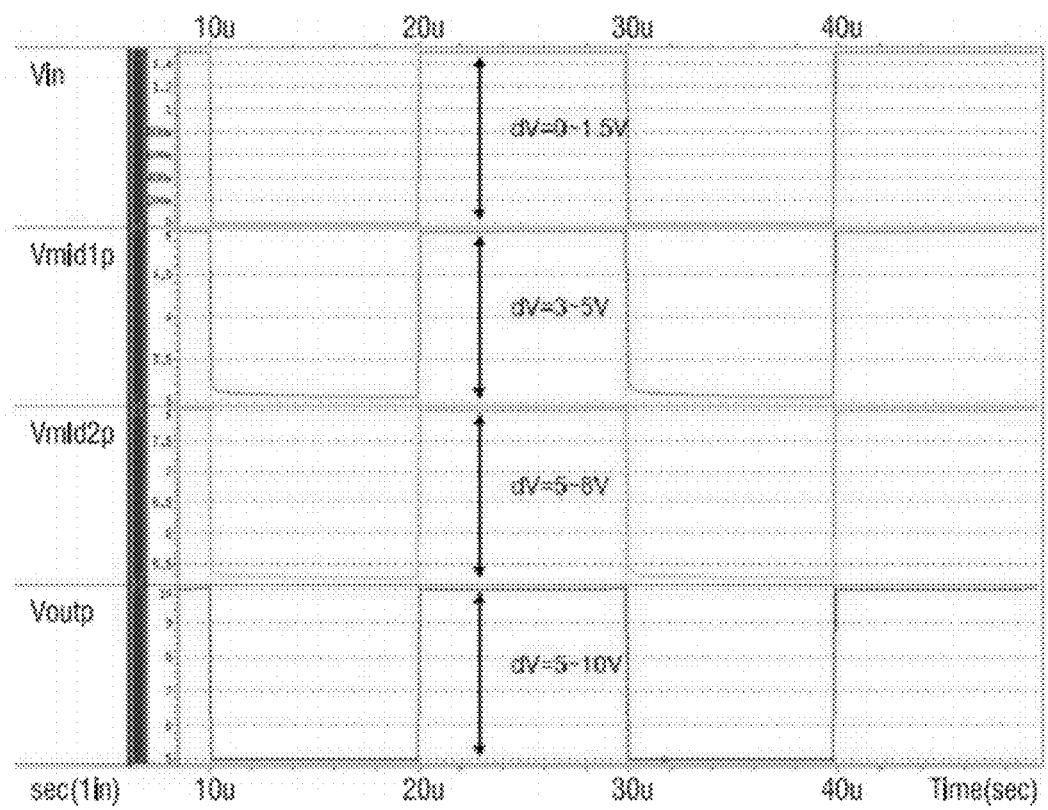
FIG. 5 is a waveform illustrating an operation of the level shifter according to the second example embodiment.

FIG. 5 is a waveform diagram explaining an operation of the level shifter according to the second example embodiment.

Referring to FIG. 5, it can be seen that the level shifter 1000' may convert the external input signal Vin having a voltage range of 0 V to 1.5 V into the signal Vmid1p having the first-voltage range 0 V to 5 V using the first-level shifter unit 100 and output the converted signal Vmid1p.

In addition, it can be seen that the level shifter 1000' may convert the signal Vmid1p in the first voltage range of 0V to 5 V into the signal Vmid2p in the second voltage range of 3V to 8 V, using the second shifter level shifter unit 200, and output the converted signal Vmid2p.

Further, it can be seen that the level shifter 1000' may convert the signal Vmid2p in the second voltage range of 3V to 8 V into the signal Voutp in the third voltage range of 5V to 10 V and output the converted signal Voutp.

The level shifters 1000 and 1000' may be used as a level shifter that drives active matrix organic light emitting diodes (LEDs).

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A level shifter, comprising:
   a first-level shifter unit configured to convert an external input signal into a signal in a preset first-voltage range using a plurality of transistors and a first clamping power supply and output the converted signal; and
   a second-level shifter unit configured to convert the signal output from the first-level shifter unit into a signal in a preset second-voltage range using a plurality of transistors and a second clamping power supply and output the converted signal, wherein an upper-threshold voltage of the second-voltage range is higher than that of the first-voltage range and a lower-threshold voltage of the second-voltage range is higher than that of the first-voltage range, wherein, in each of the plurality of transistors in the first-level shifter unit and the plurality of transistors in the second-level shifter unit, a voltage between a gate and a source thereof is equal to or less than 6 V, and wherein the first clamping power supply is directly received by the gates of two of the plurality of transistors of the first-level shifter and configured to prevent the signal output of the first-level shifter unit from being lower than the lower-threshold voltage of the second-level shifter.

2. The level shifter as claimed in claim 1, wherein the first-level shifter unit includes:

a first transistor and a second transistor arranged in a pair and commonly connected to a first power supply having a first voltage level;

a third transistor having a gate that receives the first clamping power supply and a source that is commonly connected to a drain of the first transistor and to a gate of the second transistor;

a fourth transistor having a gate that receives the first clamping power supply and a source that is commonly connected to a gate of the first transistor and to a drain of the second transistor;

a fifth transistor having a gate that receives the external input signal, a drain that is connected to a drain of the third transistor, and a source that is connected to a second power supply having a second voltage level;

an inverter configured to invert the external input signal and output the inverted external input signal; and a sixth transistor having a gate that receives the external input signal inverted in the inverter, a drain that is connected to a drain of the fourth transistor, and a source that is connected to the second power supply, wherein a connection node between the first transistor and the third transistor is a first output terminal of the first-level shifter unit, and a connection node between the second transistor and the fourth transistor is a second output terminal of the first-level shifter unit.

3. The level shifter as claimed in claim 2, wherein the first transistor, the second transistor, the third transistor and the fourth transistor are PMOS transistors; and the fifth transistor and the sixth transistor are NMOS transistors.

4. The level shifter as claimed in claim 2, wherein the first voltage level is 5 V, the second voltage level is 0 V, and the first clamping power supply voltage is 2 V.

5. The level shifter as claimed in claim 2, wherein the second-level shifter unit includes:

a seventh transistor and an eighth transistor arranged in a pair and commonly connected to a third power supply having a third voltage level;

a ninth transistor having a gate that receives the second clamping power supply, and a source that is commonly connected to a drain of the seventh transistor and to a gate of the eighth transistor;

a tenth transistor having a source that is commonly connected to a gate of the seventh transistor and to a drain of the eighth transistor;

an eleventh transistor having a gate that is connected to the second output terminal of the first-level shifter unit, a drain that is connected to a drain of the ninth transistor, and a source that is connected to a fourth power supply having a fourth voltage level; and a twelfth transistor having a gate that is connected to the first output terminal of the first-level shifter unit, a drain that is connected to a drain of the tenth transistor, and a source that is connected to the fourth power supply, wherein a connection node between the seventh transistor and the ninth transistor is a third output terminal of the second-level shifter unit, and a connection node between the eighth transistor and the tenth transistor is a fourth output terminal of the second-level shifter unit.

6. The level shifter as claimed in claim 5, wherein the seventh transistor, the eighth transistor, the ninth transistor and the tenth transistor are PMOS transistors; and the eleventh transistor and the twelfth transistor are NMOS transistors.

7. The level shifter as claimed in claim 5, wherein the third voltage level is 8 V, the fourth voltage level is 3V, and the second clamping power supply voltage is 4 V.

8. The level shifter as claimed in claim 5, further comprising a third-level shifter unit configured to convert the signal output from the second-level shifter unit into a signal in a preset third-voltage range using a plurality of transistors and output the converted signal, wherein an upper-threshold voltage of the third-voltage range is higher than that of the second voltage level and a lower-threshold voltage of the third-voltage range is higher than that of the second-voltage range, wherein, in each of the plurality of transistors, a voltage difference between a gate and a source is equal to or less than 6V.

9. The level shifter as claimed in claim 8, wherein the third-level shifter unit includes:

a thirteenth transistor and a fourteenth transistor arranged in a pair and commonly connected to a fifth power supply having a fifth voltage level;

a fifteenth transistor having a gate that is connected to one of the third output terminal and the fourth output terminal of the second-level shifter unit, a drain that is commonly connected to a drain of the thirteenth transistor and a gate of the fourteenth transistor, and a source that is connected to a sixth power supply having a sixth voltage level; and a sixteenth transistor having a gate that is connected to the other of the third output terminal and the fourth output terminal of the second-level shifter unit, a drain that is commonly connected to a gate of the thirteenth transistor and a drain of the fourteenth transistor, and a source that is connected to the sixth power supply, wherein a connection node between the thirteenth transistor and the fifteenth transistor is a fifth output terminal of the third-level shifter unit, and a connection node between the fourteenth transistor and the sixteenth transistor is a sixth output terminal of the third-level shifter unit.

10. The level shifter as claimed in claim 9, wherein the thirteenth transistor and the fourteenth transistor are PMOS transistors, and the fifteenth transistor and the sixteenth transistor are NMOS transistors.

11. The level shifter as claimed in claim 9, wherein the fifth voltage level is 10 V, and the sixth voltage level is 5V.

12. The level shifter as claimed in claim 9, wherein the first-voltage range ranges from 0 V to 5 V, the second-voltage range ranges from 3 V to 8 V, and the third-voltage range ranges from 5 V to 10 V.

13. A system on chip comprising a plurality of blocks and a level shifter according to claim 1.

14. A method of operating a level shifter, comprising:
converting an external input signal into a first signal in a preset first-voltage range with a first set of transistors and a first clamping power supply; and
converting the first signal into a second signal in a preset second-voltage range using a second set of transistors and a second clamping power supply,
wherein an upper-threshold voltage of the second-voltage range is higher than an upper-threshold voltage of the first-voltage range, and a lower-threshold voltage of the second-voltage range is higher than a lower-threshold voltage of the first-voltage range,
wherein the first set and the second set of transistors are medium-voltage transistors, and
wherein the first clamping power supply is directly received the gates of two of the first set of transistors and configured to prevent the first signal from being lower than the lower-threshold voltage of the second-level shifter.

15. The method of claim 14, wherein a voltage difference between a gate and a source of each transistor in the first set and the second set of transistors is equal to or less than 6 V.

16. The method of claim 14, wherein a voltage difference between a gate and a drain of each transistor in the first set and the second set of transistors is equal to or less than 6 V.

17. The method of claim 14, wherein the first set of transistors comprises:
a first transistor and a second transistor arranged in a pair and commonly connected to a first power supply having a first voltage level;
a third transistor having a gate that receives the first clamping power supply and a source that is commonly connected to a drain of the first transistor and a gate of the second transistor;
a fourth transistor having a gate that receives the first clamping power supply and a source that is commonly connected to a gate of the first transistor and a drain of the second transistor;
a fifth transistor having a gate that receives the external input signal, a drain that is connected to a drain of the third transistor, and a source that is connected to a second power supply having a second voltage level;
an inverter configured to invert the external input signal and output the inverted external input signal; and
a sixth transistor having a gate that receives the external input signal inverted in the inverter, a drain that is connected to a drain of the fourth transistor, and a source that is connected to the second power supply.

18. The method of claim 17, wherein the second set of transistors comprises:

a seventh transistor and an eighth transistor arranged in a pair and commonly connected to a third power supply having a third voltage level;
a ninth transistor having a gate that receives the second clamping power supply, and a source that is commonly connected to a drain of the seventh transistor and to a gate of the eighth transistor;
a tenth transistor having a source that is commonly connected to a gate of the seventh transistor and to a drain of the eighth transistor;
an eleventh transistor having a gate that is connected to the second output terminal of the first-level shifter unit, a drain that is connected to a drain of the ninth transistor, and a source that is connected to a fourth power supply having a fourth voltage level; and
a twelfth transistor having a gate that is connected to the first output terminal of the first-level shifter unit, a drain that is connected to a drain of the tenth transistor, and a source that is connected to the fourth power supply.

19. The method of claim 18, wherein the first transistor, the second transistor, the third transistor and the fourth transistor are PMOS transistors; and the fifth transistor and the sixth transistor are NMOS transistors.

20. The method of claim 19, wherein the seventh transistor, the eighth transistor, the ninth transistor and the tenth transistor are PMOS transistors; and the eleventh transistor and the twelfth transistor are NMOS transistors.

21. The method of claim 14, further comprising:
converting the second signal into a third signal in a preset third-voltage range using a third set of transistors,
wherein an upper-threshold voltage of the third-voltage range is higher than an upper-threshold voltage of the second voltage level, and a lower-threshold voltage of the third-voltage range is higher than a lower-threshold voltage of the second-voltage range, and
the first set, the second set and the third set of transistors are medium-voltage transistors.

22. The level shifter as claimed in claim 1, wherein:
the first-level shifter unit is configured to be powered by a first direct-current (dc) voltage source,
the second-level shifter unit is configured to be powered by a second dc voltage source, and
the first- and second-level shifter units are configured such that the lower voltage potential applied by the second dc voltage source is greater, with respect to a reference voltage of the level shifter, than the lower voltage potential applied by the first dc voltage source.

* * * * *